US012772827B2

(12) United States Patent
Iwahori

(10) Patent No.: US 12,772,827 B2
(45) Date of Patent: Oct. 20, 2026

(54) SEMICONDUCTOR INTEGRATED CIRCUIT DEVICE

(71) Applicant: Socionext Inc., Kanagawa (JP)

(72) Inventor: Junji Iwahori, Yokohama (JP)

(73) Assignee: Socionext Inc., Kanagawa (JP)

( * ) Notice: Subject to any disclaimer, the term of this patent is extended or adjusted under 35 U.S.C. 154(b) by 337 days.

(21) Appl. No.: 18/752,353

(22) Filed: Jun. 24, 2024

(65) Prior Publication Data

US 2024/0347460 A1 Oct. 17, 2024

Related U.S. Application Data

(63) Continuation of application No. PCT/JP2022/044249, filed on Nov. 30, 2022.

(30) Foreign Application Priority Data

Dec. 27, 2021 (JP) ................................ 2021-212959

(51) Int. Cl.
*H10W 20/41* (2026.01)
*H10D 89/10* (2025.01)
*H10W 20/20* (2026.01)

(52) U.S. Cl.
CPC .......... *H10W 20/427* (2026.01); *H10D 89/10* (2025.01); *H10W 20/20* (2026.01)

(58) Field of Classification Search
CPC ... H10W 20/427; H10W 20/20; H10W 20/01; H10W 20/40; H10W 90/00; H10D 89/10; H10D 84/981; H10D 84/01; H10D 84/0165; H10D 84/038; H10D 84/85; H10P 14/40
USPC .......................................................... 257/774
See application file for complete search history.

(56) References Cited

U.S. PATENT DOCUMENTS 10,170,413 B2 1/2019 Ohtou et al.
10,872,818 B2 12/2020 Chiang et al.
2018/0308826 A1* 10/2018 Kawaminami .... H03K 5/15026
2021/0210466 A1* 7/2021 Okamoto ............... H10D 84/83
(Continued)

FOREIGN PATENT DOCUMENTS

JP 2005-032839 A 2/2005
JP 2018182213 A * 11/2018 .......... H10W 90/701
(Continued)

OTHER PUBLICATIONS

International Search Report dated Feb. 14, 2023 issued in International Patent Application No. PCT/JP2022/044249, with English translation.

*Primary Examiner* — Moazzam Hossain
(74) *Attorney, Agent, or Firm* — Rimon P.C.

(57) ABSTRACT

First and second semiconductor chips are stacked one upon the other with the back face of the first semiconductor chip opposed to the principal face of the second semiconductor chip. The first semiconductor chip includes: first and second power lines formed in a buried interconnect layer, extending in the X direction, and adjoining each other in the Y direction; first and second contacts provided between the first and second power lines and the chip back face; and a third contact provided between a signal line and the chip back face. The third contact has an overlap with the first power line in the Y direction and is at a position different from the positions of the first and second contacts in the X direction, in planar view.

19 Claims, 12 Drawing Sheets

(56) References Cited

U.S. PATENT DOCUMENTS

| | | | |
|---|---|---|---|
| 2021/0210468 | A1 | 7/2021 | Takeno et al. |
| 2022/0231054 | A1 | 7/2022 | Okamoto et al. |

FOREIGN PATENT DOCUMENTS

| | | | | |
|---|---|---|---|---|
| WO | 2020/065916 | A1 | 4/2020 | |
| WO | WO-2020066797 | A1 * | 4/2020 | ............ H10W 72/00 |
| WO | 2021/070367 | A1 | 4/2021 | |

* cited by examiner

SEMICONDUCTOR INTEGRATED CIRCUIT DEVICE

CROSS-REFERENCE TO RELATED APPLICATIONS

This is a continuation of International Application No. PCT/JP2022/044249 filed on Nov. 30, 2022, which claims priority to Japanese Patent Application No. 2021-212959 filed on Dec. 27, 2021. The entire disclosures of these applications are incorporated by reference herein.

BACKGROUND

The present disclosure relates to a semiconductor integrated circuit device having stacked semiconductor chips.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

For higher integration of a semiconductor integrated circuit, it is proposed to use, for standard cells, interconnects laid in a buried interconnect layer, not interconnects laid in a metal interconnect layer formed above transistors as conventionally done.

U.S. Pat. No. 10,170,413 (FIG. 2C) discloses a technique of using interconnects laid in a buried interconnect layer not only as power lines (buried power rails (BPRs)) but also as signal lines. U.S. Pat. No. 10,872,818 discloses a technique of connecting buried power rails to a chip back face by way of through silicon vias (TSVs).

In the cited patent documents, however, no disclosure has been made on how to connect signal lines formed in a main chip to the chip back face.

An objective of the present disclosure is providing, in a semiconductor integrated circuit device having stacked semiconductor chips, an easily-manufacturable and reliable configuration of connecting signal lines formed in a main chip to the chip back face.

SUMMARY

According to the first mode of the present disclosure, a semiconductor integrated circuit device includes: a first semiconductor chip; and a second semiconductor chip stacked on the first semiconductor chip, wherein a back face of the first semiconductor chip and a principal face of the second semiconductor chip are opposed to each other, the first semiconductor chip includes a plurality of standard cells, a first power line laid in a buried interconnect layer, extending in a first direction and supplying a first power supply voltage to the plurality of standard cells, a second power line laid in the buried interconnect layer, extending in the first direction, placed adjacently to the first power line in a second direction perpendicular to the first direction, and supplying a second power supply voltage to the plurality of standard cells, a third power line laid in the buried interconnect layer, extending in the first direction, placed adjacently to the second power line in the second direction on a side opposite to the first power line, and supplying the first power supply voltage to the plurality of standard cells, a first contact provided between the first power line and the back face of the first semiconductor chip, a second contact provided between the second power line and the back face of the first semiconductor chip, and a third contact provided between a first signal line connected to any of the plurality of standard cells and the back face of the first semiconductor chip, and the third contact has an overlap with the second power line in the second direction and is at a position different from positions of the first and second contacts in the first direction, in planar view.

According to the above mode, the first and second semiconductor chips are stacked one upon the other with the back face of the first semiconductor chip opposed to the principal face of the second semiconductor chip. The first semiconductor chip includes the first, second, and third power lines formed in the buried interconnect layer, extending in the first direction, and adjoining one another in the second direction. The first semiconductor chip also includes the first and second contacts provided between the first and second power lines and the chip back face, and the third contact provided between the signal line and the chip back face. The third contact has an overlap with the second power line in the second direction and is at a position different from the positions of the first and second contacts in the first direction, in planar view. Therefore, the spacing between the third contact and the first and second contacts can be sufficiently secured, and thus, even when the size of the third contact in planar view is made large, the manufacture can be easy and the reliability can be secured.

According to the second mode of the present disclosure, a semiconductor integrated circuit device includes: a first semiconductor chip; and a second semiconductor chip stacked on the first semiconductor chip, wherein a back face of the first semiconductor chip and a principal face of the second semiconductor chip are opposed to each other, the first semiconductor chip includes a plurality of standard cells, a first power line laid in a buried interconnect layer, extending in a first direction and supplying a first power supply voltage to the plurality of standard cells, a second power line laid in the buried interconnect layer, extending in the first direction, placed adjacently to the first power line in a second direction perpendicular to the first direction, and supplying a second power supply voltage to the plurality of standard cells, a third power line laid in the buried interconnect layer, extending in the first direction, placed adjacently to the second power line in the second direction on a side opposite to the first power line, and supplying the first power supply voltage to the plurality of standard cells, a first contact provided between the first power line and the back face of the first semiconductor chip, a second contact provided between the second power line and the back face of the first semiconductor chip, and a third contact provided between a first signal line connected to any of the plurality of standard cells and the back face of the first semiconductor chip, and the third contact has an overlap with the second contact in the second direction and is at a position different from positions of the first and second contacts in the first direction, in planar view.

According to the above mode, the first and second semiconductor chips are stacked one upon the other with the back face of the first semiconductor chip opposed to the principal face of the second semiconductor chip. The first semiconductor chip includes the first, second, and third power lines formed in the buried interconnect layer, extending in the first direction, and adjoining one another in the second direction. The first semiconductor chip also includes the first and second contacts provided between the first and second power lines and the chip back face, and the third contact provided between the signal line and the chip back face. The third contact has an overlap with the second contact in the second direction and is at a position different from the positions of the first and second contacts in the first direction, in planar view. Therefore, the spacing between the third contact and the first and second contacts can be sufficiently secured, and thus even when the size of the third contact in planar view is made large, the manufacture can be easy and the reliability can be secured.

According to the third mode of the present disclosure, a semiconductor integrated circuit device includes: a first semiconductor chip; and a second semiconductor chip stacked on the first semiconductor chip, wherein a back face of the first semiconductor chip and a principal face of the second semiconductor chip are opposed to each other, the first semiconductor chip includes a plurality of standard cells, a first power line laid in a buried interconnect layer, extending in a first direction and supplying a first power supply voltage to the plurality of standard cells, a first contact provided between the first power line and the back face of the first semiconductor chip, and a second contact provided between a first signal line connected to any of the plurality of standard cells and the back face of the first semiconductor chip, and the first power line has a first portion and a second portion apart from each other in the first direction, and the second contact is located between the first portion and the second portion in the first direction and has an overlap with the first power line in a second direction perpendicular to the first direction, in planar view.

According to the above mode, the first and second semiconductor chips are stacked one upon the other with the back face of the first semiconductor chip opposed to the principal face of the second semiconductor chip. The first semiconductor chip includes the first power line formed in the buried interconnect layer, extending in the first direction. The first semiconductor chip also includes the first contact provided between the first power line and the chip back face, and the second contact provided between the signal line and the chip back face. The first power line has the first and second portions apart from each other in the first direction. The second contact is located between the first portion and the second portion in the first direction and has an overlap with the first power line in the second direction perpendicular to the first direction, in planar view. Therefore, even when the plane size of the second contact is made large, shorting between the second contact and the first power line can be avoided, and thus, the manufacture can be easy and the reliability can be secured.

According to the present disclosure, in a semiconductor integrated circuit device having stacked semiconductor chips, it is possible to implement an easily-manufacturable and reliable configuration of connecting signal lines formed in a main chip to the chip back face.

DETAILED DESCRIPTION

An embodiment of the present disclosure will be described hereinafter with reference to the accompanying drawings. Note that, in the following description, in the plan views such as FIG. 2, the horizontal direction in the figure is called an X direction (corresponding to the first direction), the vertical direction in the figure is called a Y direction (corresponding to the second direction), and the direction perpendicular to the substrate plane is called a Z direction (corresponding to the depth direction). Also, "VDD" indicates a power supply voltage, a high-voltage side power supply itself, or a high-voltage side power line, and "VSS" indicates a power supply voltage, a low-voltage side power supply itself, or a low-voltage side power line. Note also that standard cells are herein simply referred to as "cells" as appropriate.

Embodiment

Figure 1:
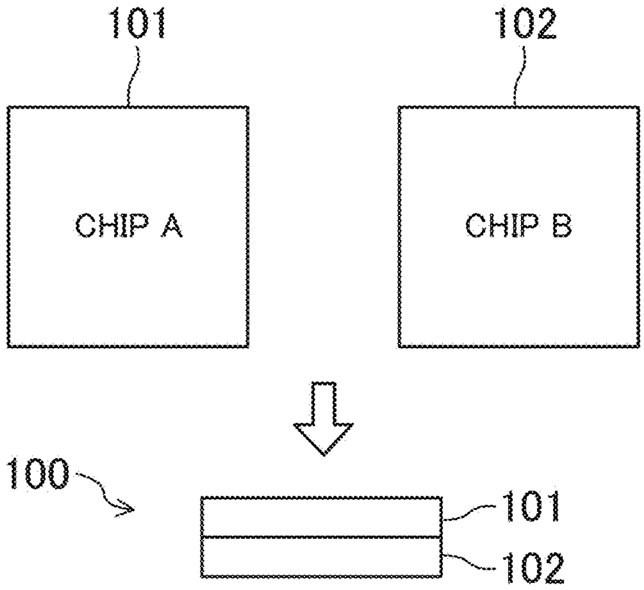
FIG. 1 shows an entire configuration of a semiconductor integrated circuit device according to an embodiment.

FIG. 1 is a view showing the entire configuration of a semiconductor integrated circuit device according to an embodiment. As shown in FIG. 1, a semiconductor integrated circuit device 100 is constituted by a first semiconductor chip 101 (chip A, main chip) and a second semiconductor chip 102 (chip B, back chip) stacked one upon the other. In the first semiconductor chip 101, a circuit including a plurality of transistors is formed. In the second semiconductor chip 102, no elements such as transistors are formed, but power lines are formed in a plurality of interconnect layers. In the stack, the back face of the first semiconductor chip 101 and the principal face of the second semiconductor chip 102 are opposed to each other.

Figure 2:
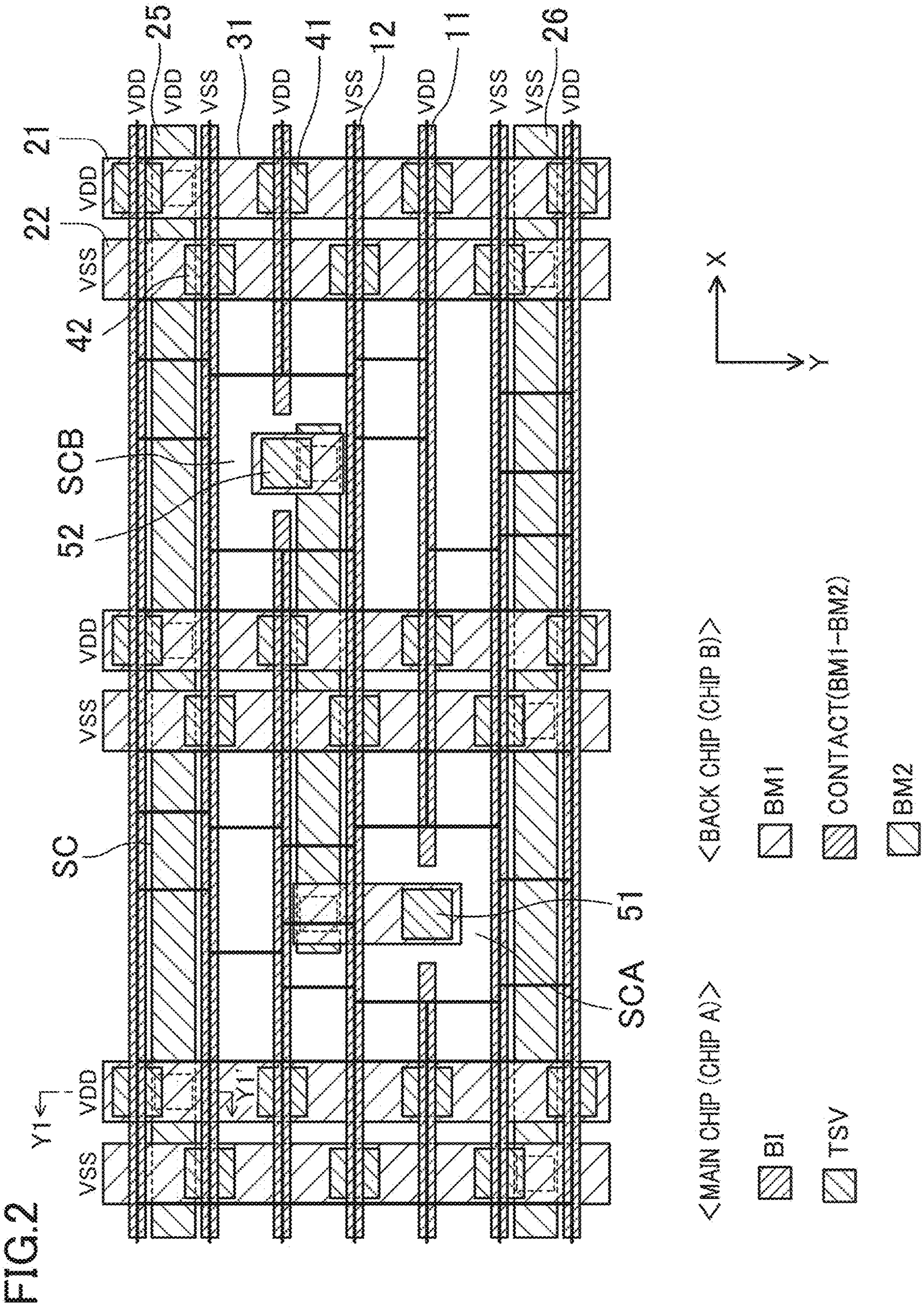
FIG. 2 shows a block layout example of the semiconductor integrated circuit device of FIG. 1.
Figure 3:
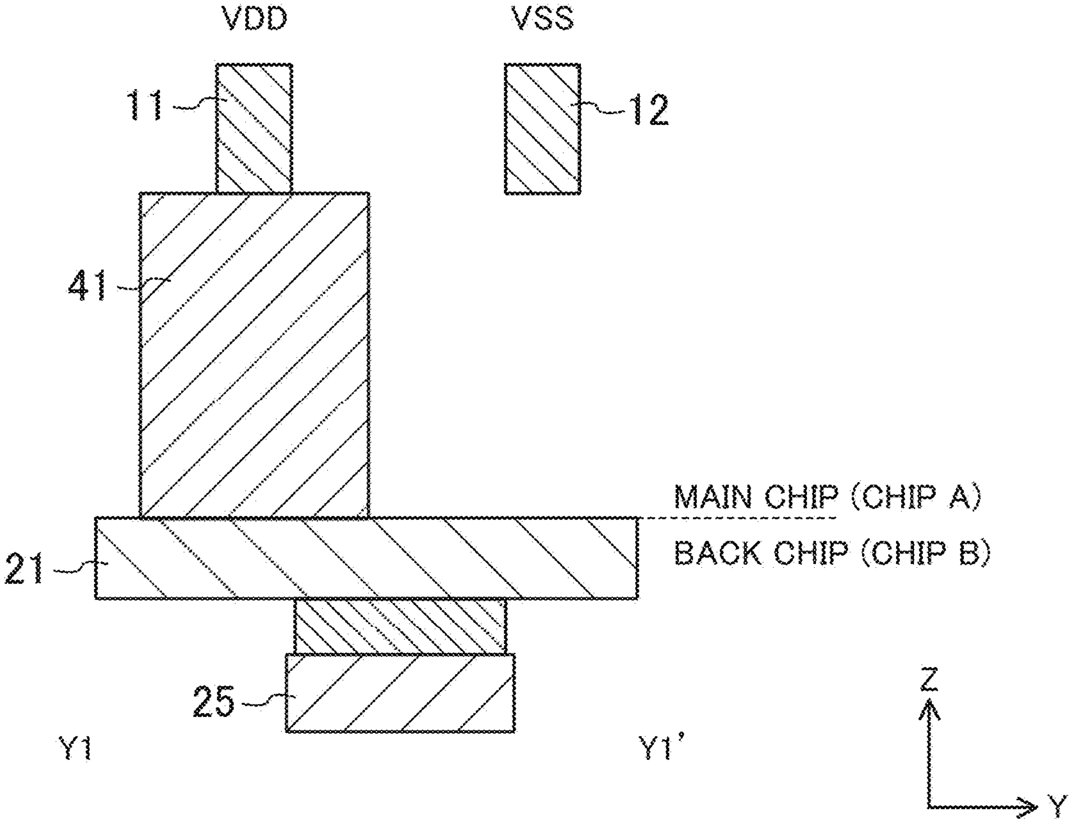
FIG. 3 is a cross-sectional view of a structure in FIG. 2.

FIG. 2 is a plan view showing a block layout example of the semiconductor integrated circuit device of FIG. 1, and FIG. 3 is a cross-sectional view showing a cross-sectional structure taken along line Y1-Y1' in FIG. 2. In the block layout of FIG. 2, a plurality of standard cells SC are arranged in the X and Y directions in the first semiconductor chip 101. Note that, in FIG. 2, only power lines formed in a buried interconnect layer (BI) and contacts (TSVs) are illustrated in the first semiconductor chip 101, and only interconnects formed in a first metal interconnect layer (BM1), interconnects formed in a second metal interconnect layer (BM2), and contacts between them are illustrated in the second semiconductor chip 102.

In the first semiconductor chip 101, buried power lines 11 supplying VDD to the standard cells SC and buried power lines 12 supplying VSS to the standard cells SC extend in the X direction. The buried power lines 11 and the buried power lines 12 are arranged alternately in the Y direction, and the standard cells SC are each placed between the buried power line 11 and the buried power line 12, receiving VDD from the buried power line 11 and VSS from the buried power line 12.

In the second semiconductor chip 102, power lines 21 supplying VDD and power lines 22 supplying VSS extend in the Y direction in the first metal interconnect layer. The power lines 21 and 22 are each paired, arranged side by side with a predetermined spacing between them in the X direction. A power line 25 supplying VDD and a power line 26 supplying VSS extend in the X direction in the second metal interconnect layer. The power lines 21 are connected to the power line 25 through contacts, and the power lines 22 are connected to the power line 26 through contacts.

In the first semiconductor chip 101, power cells 31 are formed at positions overlapping the power lines 21 and 22 of the second semiconductor chip 102 in planar view. The power cells 31 are arranged in line in the Y direction, and each have a TSV 41 for VDD and a TSV 42 for VSS. The buried power lines 11 of the first semiconductor chip 101 and the power lines 21 of the second semiconductor chip 102 are connected through the TSVs 41. The buried power lines 12 of the first semiconductor chip 101 and the power lines 22 of the second semiconductor chip 102 are connected through the TSVs 42. The configuration of the power cells 31 will be described in detail later.

As is found from the cross-sectional view of FIG. 3, since the TSV (TSV 41 for VDD in FIG. 3) formed in the first semiconductor chip 101 is a via extending from the buried power line (buried power line 11 for VDD in FIG. 3) in the principal face portion of the first semiconductor chip 101 down to the back face thereof, its size in the Z direction (depth) is large. Similarly, the size of the TSV 42 for VSS in the Z direction is large. Therefore, in order to manufacture the TSVs with high reliability while sufficiently reducing the resistance value of the TSVs, it is necessary to increase the size of the TSVs in planar view. In other words, by increasing the plane size of the TSVs, a power supply voltage drop can be curbed.

In the block layout of FIG. 2, the TSVs 41 overlap the power lines 21 in planar view and are arranged in line the Y direction. The TSVs 42 overlap the power lines 22 in planar view and are arranged in line the Y direction. That is, the TSVs 41 for VDD and the TSVs 42 for VSS are placed at different positions from each other in the X direction. Therefore, the power lines 21 and 22 of the second semiconductor chip 102 can be laid linearly. In addition, since a sufficiently wide spacing can be secured between the TSVs 41 for VDD and the TSVs 42 for VSS, TSVs large in plane size can be manufactured easily and the reliability can be secured.

Also, in the block layout of FIG. 2, the standard cells SC include standard cells SCA and SCB each having a TSV for signal in the first semiconductor chip 101. The cells SCA and SCB are double-height cells. The cell SCA has a TSV 51 for signal, and the cell SCB has a TSV 52 for signal. The TSV 51 of the cell SCA is connected to the TSV 52 of the cell SCB through interconnects and contacts in the second semiconductor chip 102. A signal output from the cell SCA through the TSV 51 is input into the cell SCB through the TSV 52 by way of interconnects and contacts in the second semiconductor chip 102.

Details of the configurations of the standard cells SCA and SCB will be described later.

Note that, in the block layout of FIG. 2, the TSVs 51 and 52 for signal are placed at positions different from the positions of the TSVs 41 and 42 for power in the X direction. The reason for this is to sufficiently secure the distances between the TSVs, thereby casing the manufacture and also securing the reliability.

The TSVs 51 and 52 for signal are each placed at a position having an overlap with the buried power line 11 supplying VDD in the Y direction. Also, the TSVs 51 and 52 for signal are each at a position having an overlap with the TSVs 41 for power in the Y direction. Therefore, the buried power line 11 supplying VDD is disconnected at the position of the TSV 51 or 52 for signal. Note that the TSV for signal may otherwise be placed at a position having an overlap with the buried power line 12 supplying VSS in the Y direction and at a position having an overlap with the TSV 42 for power in the Y direction. In this case, the buried power line 12 supplying VSS may be made disconnected at the position of the TSV for signal.

Figures 4A, 4B, 4C:
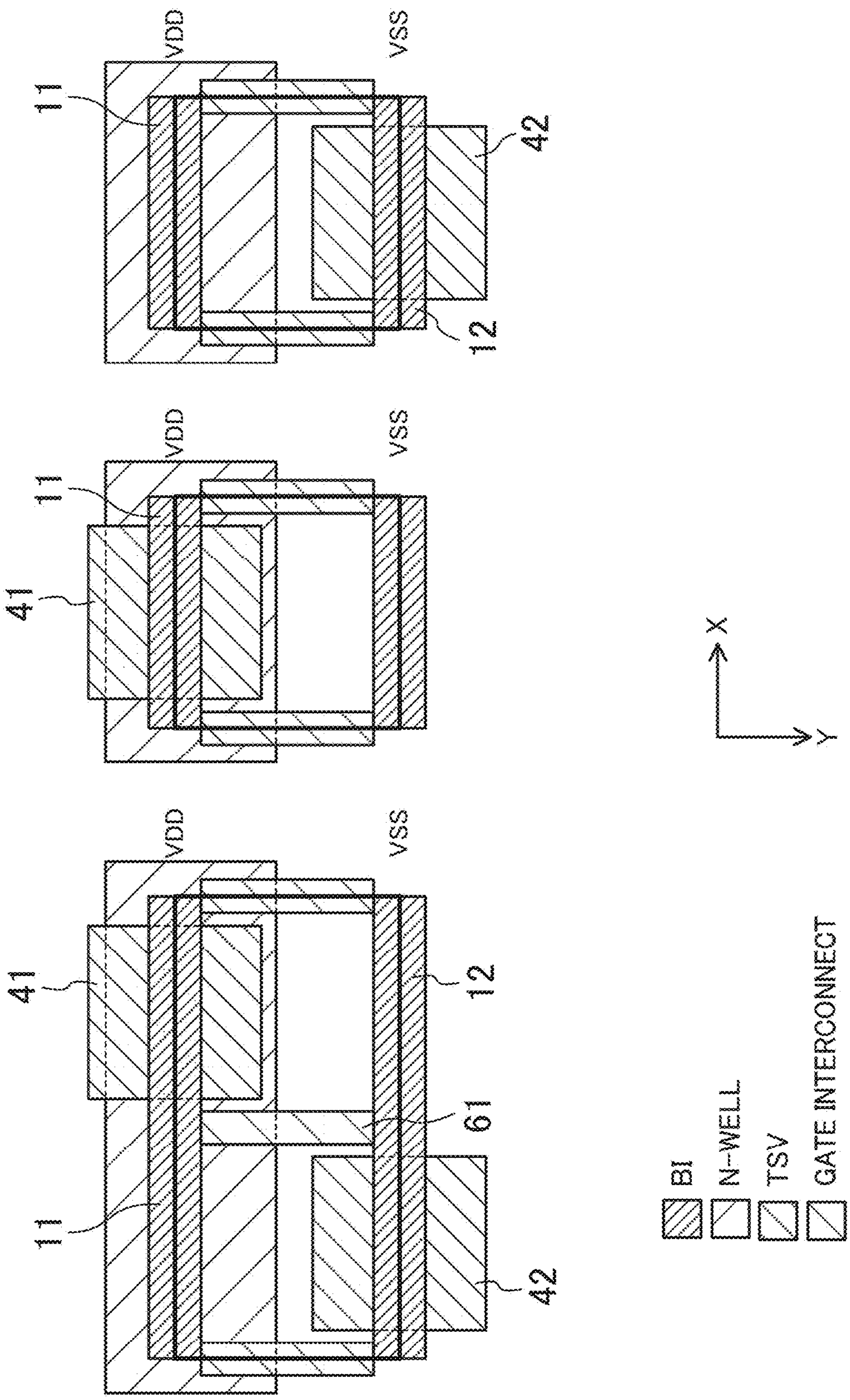
FIGS. 4A-4C show layout examples of power cells.

FIGS. 4A-4C are plan views showing layout examples of power cells. FIG. 4A shows a layout of the power cell 31 shown in FIG. 2. As shown in FIG. 4A, the power cell 31 includes the buried power line 11 supplying VDD, the buried power line 12 supplying VSS, and the TSVs 41 and 42. The TSV 41 is connected to the buried power line 11, and the TSV 42 is connected to the buried power line 12. In FIG. 4A, the power cell 31 includes dummy gates 61. Note that the power cell 31 may include a dummy transistor.

FIG. 4B is a power cell for VDD, and FIG. 4C is a power cell for VSS. The power cell shown in FIG. 4B includes only the TSV 41 for VDD, connected to the buried power line 11. The power cell shown in FIG. 4C includes only the TSV 42 for VSS, connected to the buried power line 12. By placing the power cell of FIG. 4B and the power cell of FIG. 4C next to each other in the X direction, the same layout as the power cell of FIG. 4A is formed. Note however that the power cell of FIG. 4B and the power cell of FIG. 4C are not necessarily required to be placed next to each other, but may be placed apart from each other. Also, the power cell of FIG. 4A and the power cells of FIGS. 4B and 4C may be placed in a mixed manner in a block layout.

If the size of TSVs can be made small, TSVs may be placed in normal standard cells to correspond to the buried power lines as appropriate. Since this eliminates the necessity of providing exclusive power cells, reduction in the area of the semiconductor integrated circuit device can be achieved. In this case, TSVs may just be arranged so that TSVs for VDD be lined in the Y direction and TSVs for VSS be lined in the Y direction, as in the block layout of FIG. 2. Note that the power cells and normal cells having a TSV for power may be placed in a mixed manner.

Figure 5:
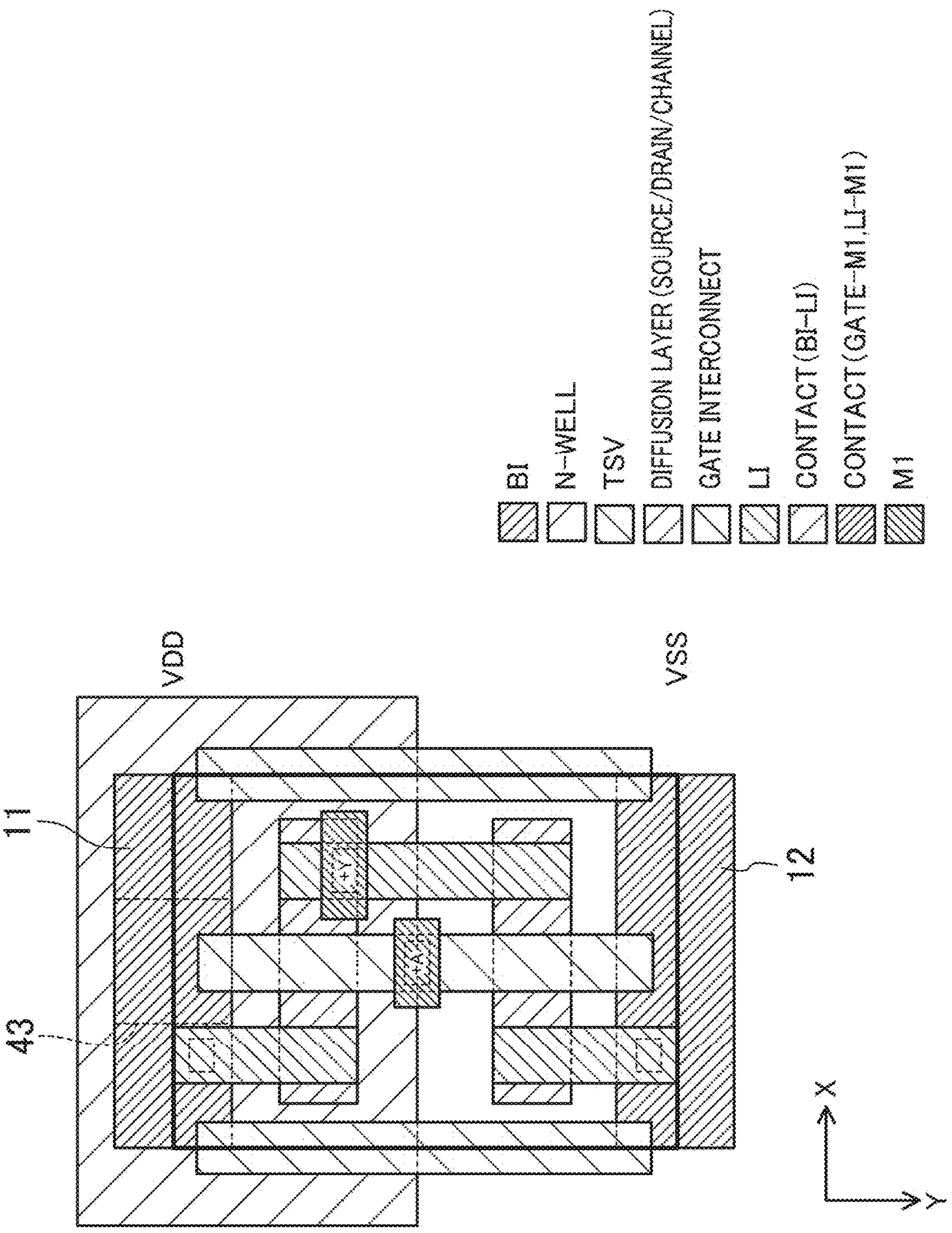
FIG. 5 shows a layout example of a normal cell having a TSV for power.

FIG. 5 shows a layout example of a normal standard cell having a TSV for a buried power line. The cell of FIG. 5 implements an inverter shown in FIG. 6. In the example of FIG. 5, a TSV 43 is provided for the buried power line 11 supplying VDD. The position of the TSV 43 is not limited to that shown in FIG. 5, but may be on a cell boundary in the X direction, for example. While the TSV 43 for VDD is placed in the example of FIG. 5, a TSV may be provided for the buried power line 12 supplying VSS. That is, both a TSV for VDD and a TSV for VSS may be placed, or either one of them may be placed, in one cell.

<Cell Having TSV for Signal>

Figure 7:
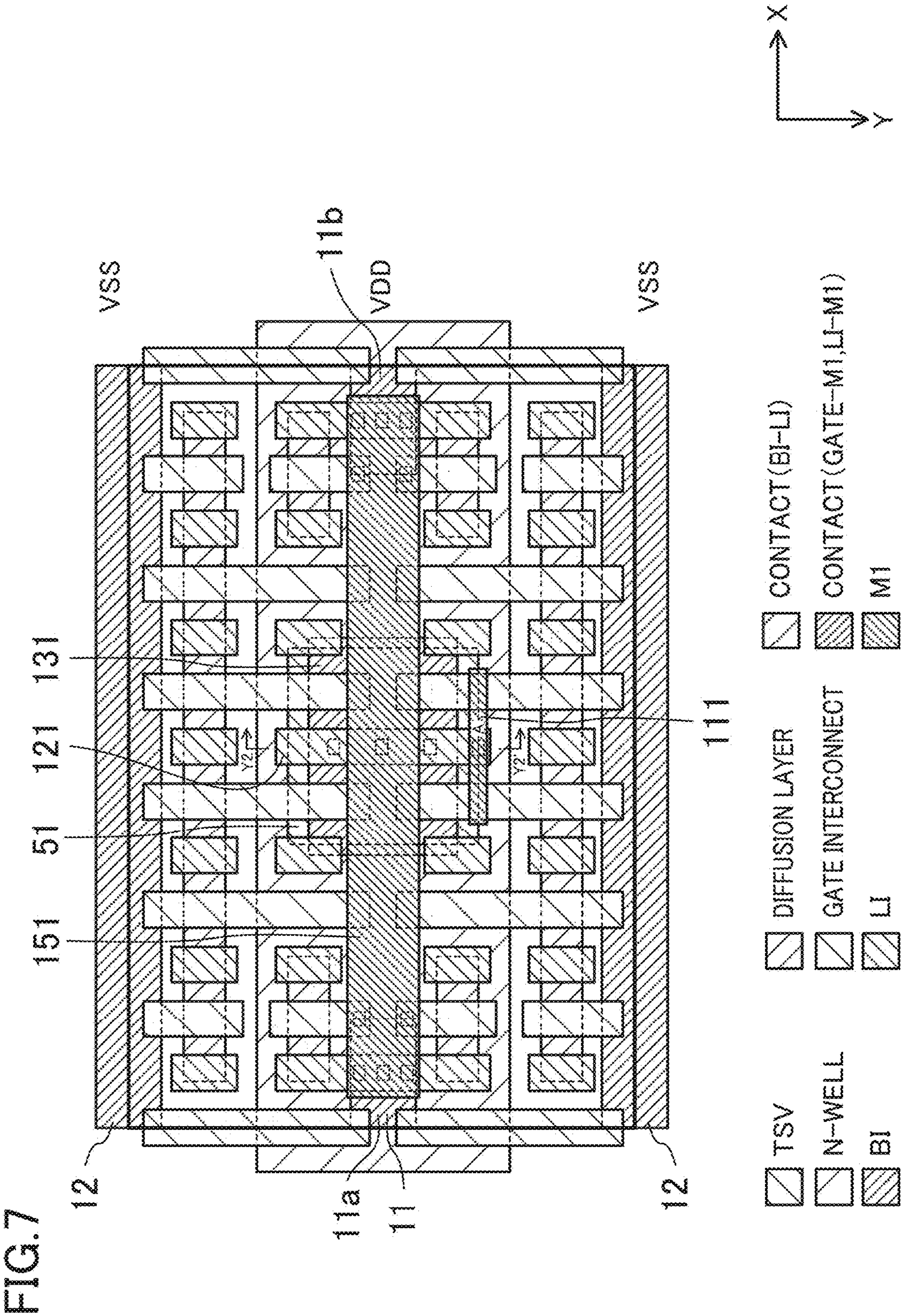
FIG. 7 is a layout example of a cell having a TSV for signal.
Figure 8:
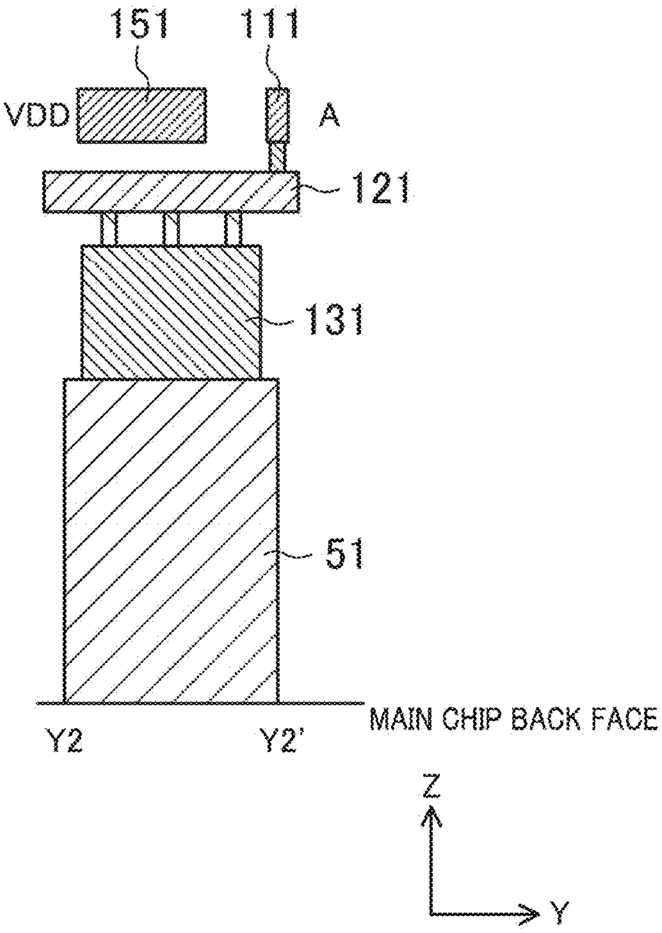
FIG. 8 is a cross-sectional view of a structure in FIG. 7.

FIG. 7 shows a layout example of a cell having a TSV for signal, showing a layout of the standard cell SCA in the block layout of FIG. 2. Note that the layout of the standard cell SCB is similar to that of FIG. 7. FIG. 8 is a cross-sectional view showing a cross-sectional structure taken along line Y2-Y2' in FIG. 7.

The cell SCA shown in FIG. 7 includes the TSV 51 for signal. The power line 11 extending in the X direction and supplying VDD is laid in the center of the cell SCA in the Y direction. The power line 11 is discontinued in the neighborhood of the position of the TSV 51. Specifically, the power line 11 has a first portion 11*a* and a second portion 11*b* apart from each other, and the TSV 51 is placed between the first portion 11*a* and the second portion 11*b*. With this, shorting between the TSV 51 and the power line 11 formed in the buried interconnect layer can be avoided. On both ends of the cell SCA in the Y direction, the power lines 12 extending in the X direction and supplying VSS are laid.

An M1 interconnect 151 extending in the X direction is formed in a metal interconnect layer (M1) located above the area in which the power line 11 is discontinued. The M1 interconnect 151 electrically connects the first portion 11*a* and the second portion 11*b* of the power line 11. With this, it is possible to prevent or reduce problems such as a power supply voltage drop caused by the discontinuity of the power line 11 due to the presence of the TSV 51. Note that, if there occurs no problem such as a power supply voltage drop, for example, the M1 interconnect 151 is not necessarily required.

Also, the cell SCA shown in FIG. 7 includes: an M1 interconnect 111 that is to be a signal terminal A; and a buried interconnect 131 and a local interconnect 121 formed above the TSV 51. The TSV 51 is connected to the M1 interconnect 111 through the buried interconnect 131 and the local interconnect 121. In the first semiconductor chip 101, by connecting a signal input or signal output of a standard cell SC to the M1 interconnect 111 that is the signal terminal A, signal input/output can be done between the standard cell SC and the second semiconductor chip 102.

In the cell SCA shown in FIG. 7, dummy transistors are placed around the TSV 51 to make the pattern uniform thereby improving the manufacturing precision and reliability. It is however not necessarily required to place dummy transistors.

While the power line 11 supplying VDD is placed in the center in the Y direction in the cell SCA shown in FIG. 7, the power line 12 supplying VSS may otherwise be placed in the center in the Y direction. In this case, the power lines 11 supplying VDD may be placed on both ends of the cell SCA in the Y direction. This also applies to the layout examples to follow.

Other Example 1

Figure 9:
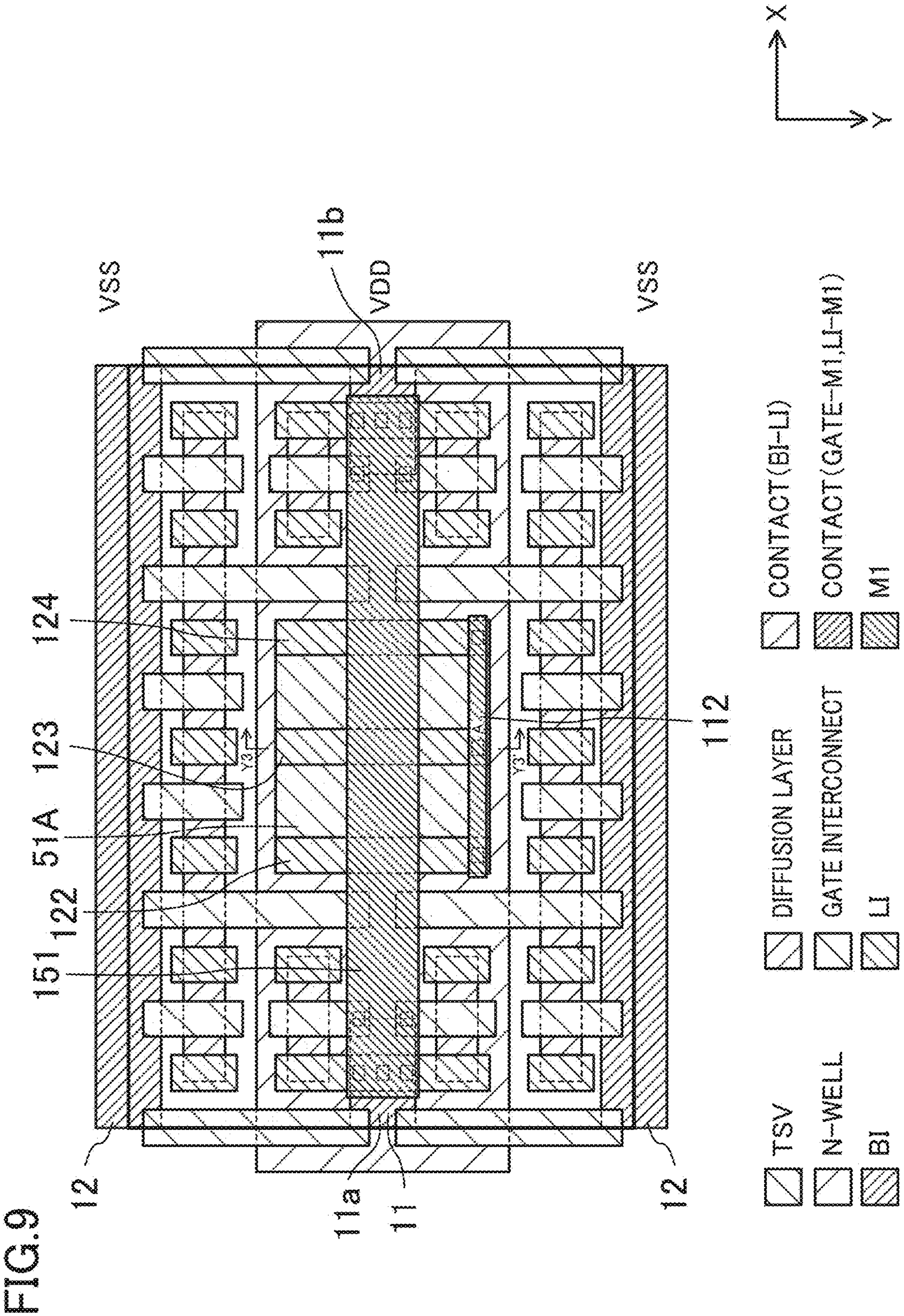
FIG. 9 is a layout example of a cell having a TSV for signal.
Figure 10:
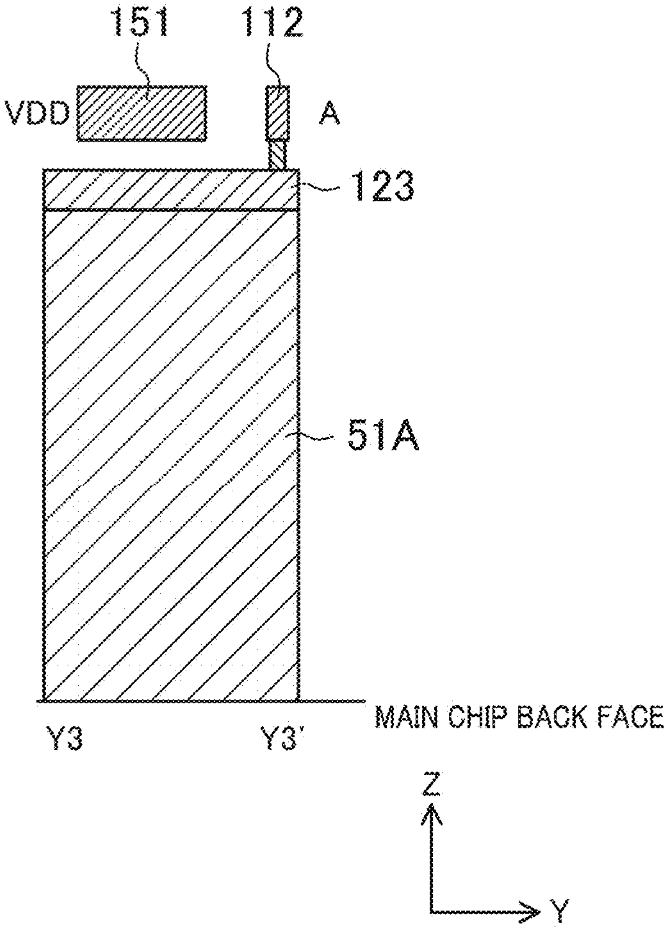
FIG. 10 is a cross-sectional view of a structure in FIG. 9.

FIG. 9 shows another layout example of a cell having a TSV for signal, and FIG. 10 is a cross-sectional view showing a cross-sectional structure taken along line Y3-Y3' in FIG. 9. In FIGS. 9 and 10, components in common with those in FIGS. 7 and 8 are denoted by the same reference characters, and detailed description of such components is omitted here in some cases.

The cell shown in FIG. 9 includes a TSV 51A larger in plane size than the TSV 51 shown in FIG. 7. No buried interconnect is formed above the TSV 51A, and the TSV 51A is directly connected to local interconnects 122, 123, and 124 formed above the TSV 51A. That is, the TSV 51A is larger in size in the Z direction (depth direction) than the TSV 51. The TSV 51A is connected to an M1 interconnect 112, which is to be a signal terminal A, through the local interconnects 122, 123, and 124. In the first semiconductor chip 101, by connecting a signal input or signal output of a standard cell SC to the M1 interconnect 112 that is the signal terminal A, signal input/output can be done between the standard cell SC and the second semiconductor chip 102.

The distance of a local interconnect from the back face of the first semiconductor chip 101 is larger than that of a buried interconnect. Therefore, the direct connection of the TSV to the local interconnect without formation of a buried interconnect may raise possibilities of damaging the case of manufacturability and lowering the performance (speed) and the reliability. In this layout example, however, the TSV 51A is formed to have a larger plane size than the TSV 51, whereby reduction in case of manufacturability, performance, and reliability can be curbed.

Other Example 2

Figure 11:
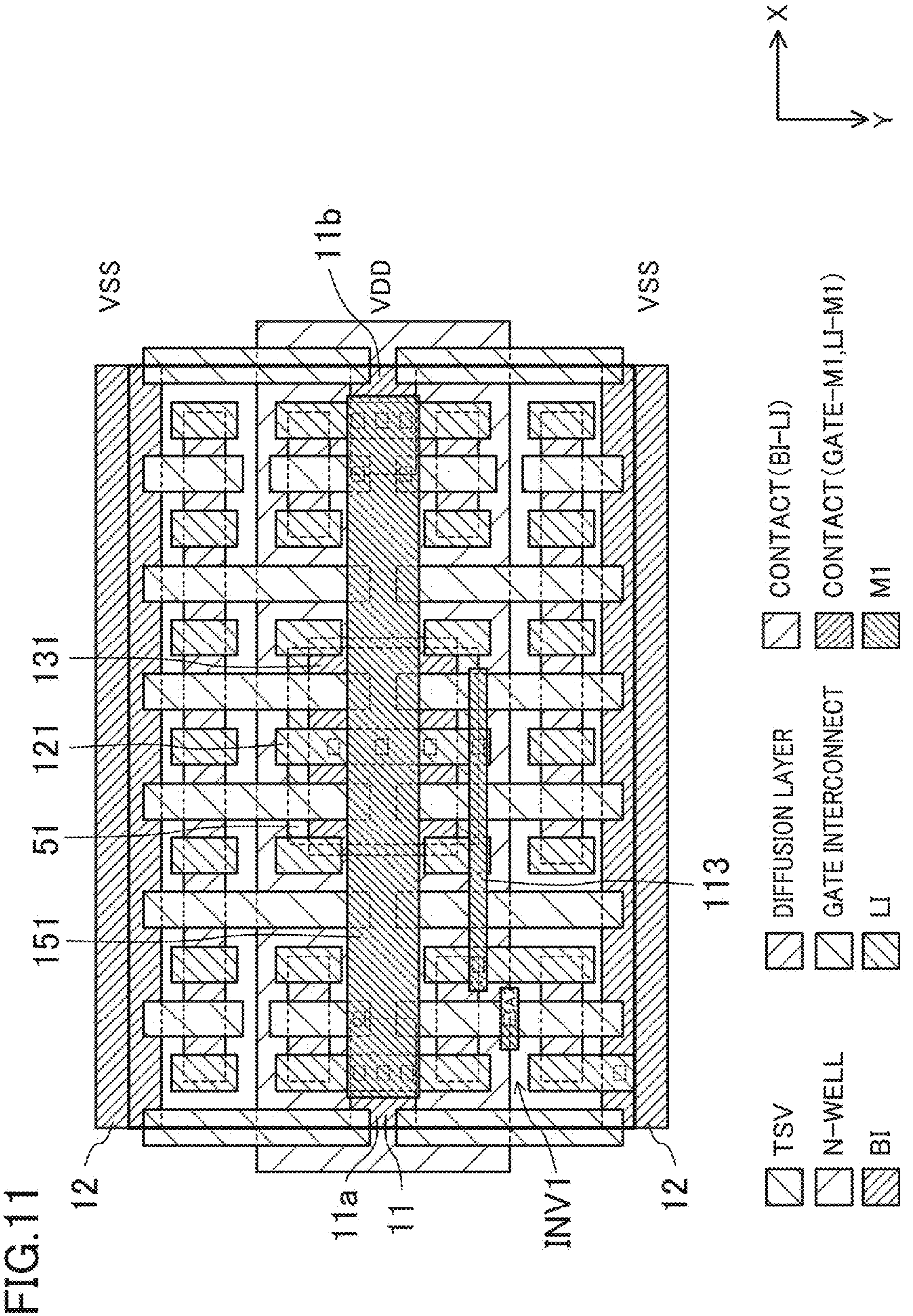
FIG. 11 is a layout example of a cell having a TSV for signal.
Figure 12:
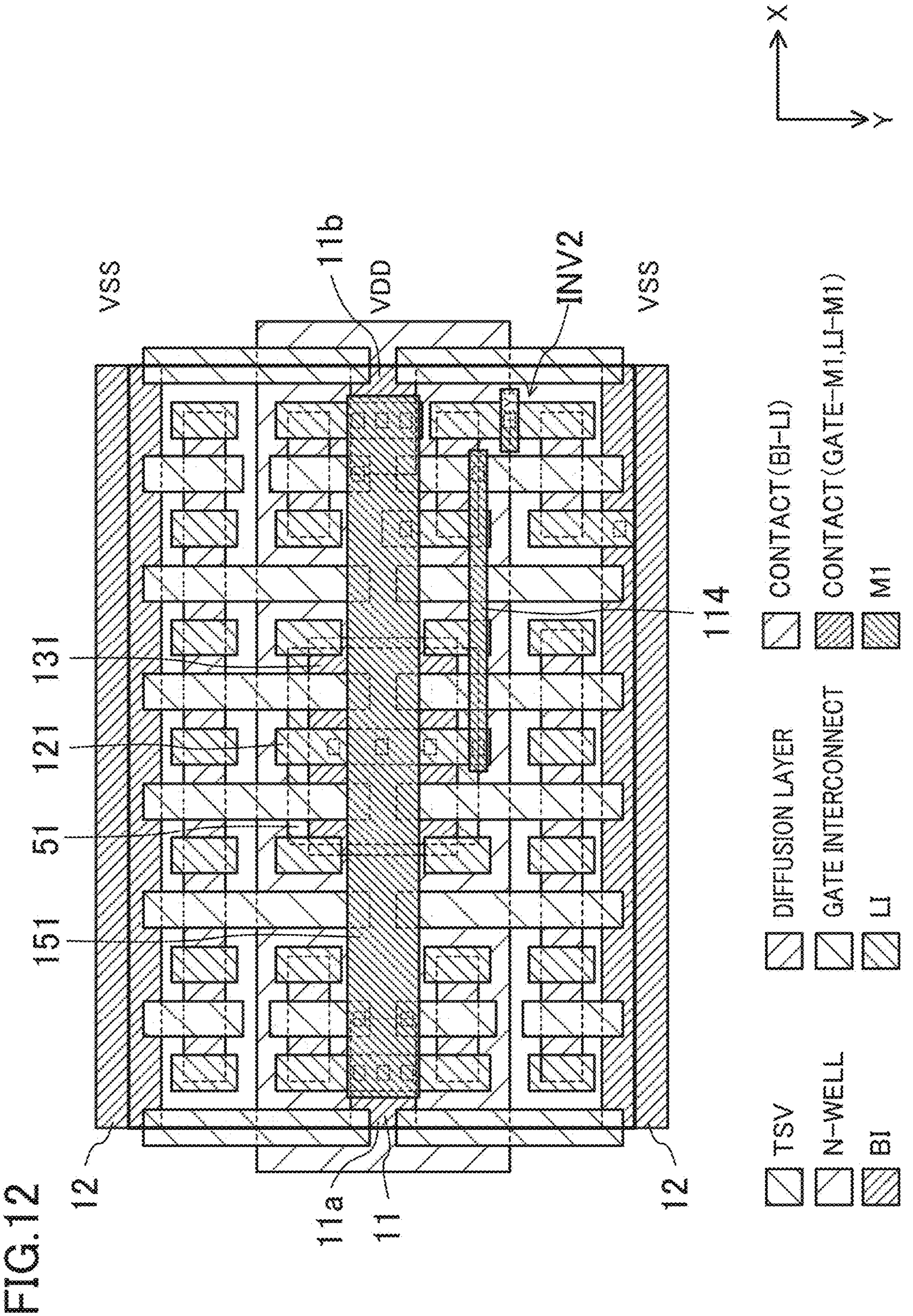
FIG. 12 is a layout example of a cell having a TSV for signal.

FIGS. 11 and 12 show other layout examples of cells having a TSV for signal. In FIGS. 11 and 12, components in common with those in FIG. 7 are denoted by the same reference characters, and detailed description of such components is omitted here in some cases.

Figure 6:
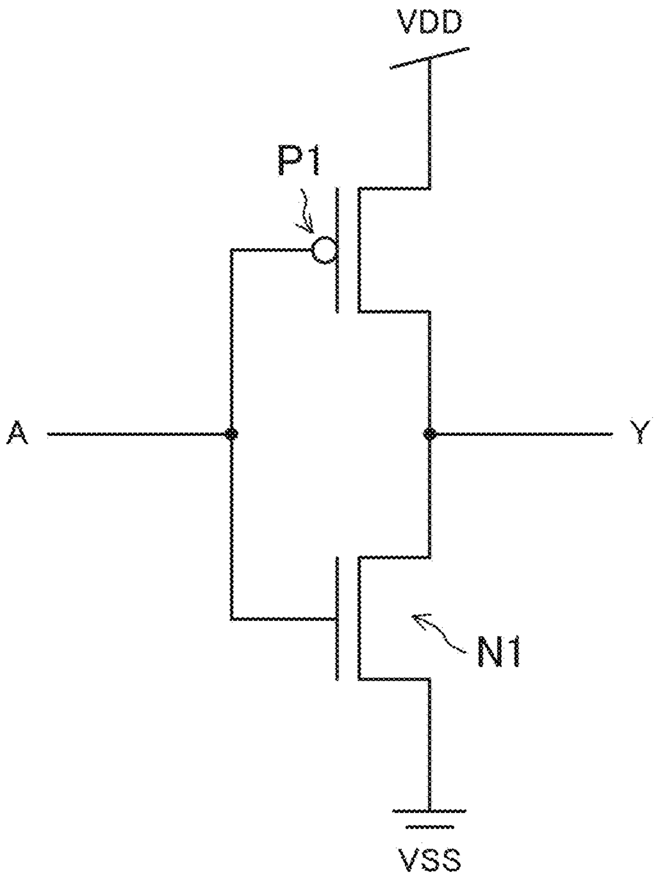
FIG. 6 shows a circuit configuration of an inverter.

The cell shown in FIG. 11 includes an inverter INV1 as an example of a logic circuit. The circuit of the inverter INV1 is as shown in FIG. 6. An M1 interconnect 113 is connected to the output of the inverter INV1. The TSV 51 is connected to the M1 interconnect 113 through the buried interconnect 131 and the local interconnect 121. Having this configuration, the output signal of the inverter INV1 can be output to the second semiconductor chip 102 through the TSV 51.

The cell shown in FIG. 12 includes an inverter INV2 as an example of a logic circuit. An M1 interconnect 114 is connected to the input of the inverter INV2. The TSV 51 is connected to the M1 interconnect 114 through the buried interconnect 131 and the local interconnect 121. Having this configuration, the input signal of the inverter INV2 can be received from the second semiconductor chip 102 through the TSV 51.

Note that the logic circuit constituted by the cell is not limited to the inverter. Note also that the layout examples shown in the FIGS. 11 and 12 may be implemented in combination with the layout example of FIG. 9.

As described above, according to this embodiment, the first semiconductor chip 101 and the second semiconductor chip 102 are stacked one upon the other with the back face of the first semiconductor chip 101 opposed to the principal face of the second semiconductor chip 102. The first semiconductor chip 101 includes the power lines 11 and 12 formed in the buried interconnect layer, extending in the X direction, and adjoining each other in the Y direction, and also includes the contacts 41 and 42 provided between the power lines 11 and 12 and the chip back face and the contacts 51 and 52 provided between the signal lines and the chip back face. The contacts 51 and 52 each have an overlap with the power line 11 in the Y direction, and are at positions different from the positions of the contacts 41 and 42 in the X direction, in planar view. Also, the contacts 51 and 52 each have an overlap with the contacts 41 in the Y direction, and are at positions different from the positions of the contacts 41 and 42 in the X direction, in planar view. With this, the spacing between the contacts 51 and 52 and the contacts 41 and 42 can be sufficiently secured. Therefore, even when the plane size of the contacts 51 and 52 is made large, the contacts can be manufactured easily and the reliability can be secured.

Also, the power line 11 has the first and second portions 11*a* and 11*b* apart from each other in the X direction. The contacts 51 and 52 are each located between the first portion 11*a* and the second portion 11*b* in the X direction, and have an overlap with the power line 11 in the Y direction, in planar view. With this, even when the plane size of the contacts 51 and 52 is made large, shorting between the contacts 51 and 52 and the power lines 11 can be avoided. Therefore, the contacts can be manufactured easily and the reliability can be secured.

According to the present disclosure, in a semiconductor integrated circuit device having stacked semiconductor chips, it is possible to implement an easily-manufacturable and reliable configuration of connecting signal lines formed in a main chip to the chip back face. The present disclosure is therefore useful for cost reduction of LSI.

The invention claimed is:

1. A semiconductor integrated circuit device, comprising:
a first semiconductor chip; and
a second semiconductor chip stacked on the first semiconductor chip,
wherein
a back face of the first semiconductor chip and a principal face of the second semiconductor chip are opposed to each other,
the first semiconductor chip includes
a plurality of standard cells,
a first power line laid in a buried interconnect layer, extending in a first direction and supplying a first power supply voltage to the plurality of standard cells,
a second power line laid in the buried interconnect layer, extending in the first direction, placed adjacently to the first power line in a second direction perpendicular to the first direction, and supplying a second power supply voltage to the plurality of standard cells,
a third power line laid in the buried interconnect layer, extending in the first direction, placed adjacently to the second power line in the second direction on a side opposite to the first power line, and supplying the first power supply voltage to the plurality of standard cells,
a first contact provided between the first power line and the back face of the first semiconductor chip,
a second contact provided between the second power line and the back face of the first semiconductor chip, and
a third contact provided between a first signal line connected to any of the plurality of standard cells and the back face of the first semiconductor chip, and
the third contact has an overlap with the second power line in the second direction and is at a position different from positions of the first and second contacts in the first direction, in planar view.

2. The semiconductor integrated circuit device of claim 1, wherein
the second semiconductor chip includes
a second signal line laid in a first interconnect layer that is an interconnect layer closest to the principal face, and
the third contact is connected to the second signal line.

3. The semiconductor integrated circuit device of claim 1, wherein
the plurality of standard cells include a first standard cell that is a double-height cell having the third contact.

4. The semiconductor integrated circuit device of claim 3, wherein
the first standard cell has a buried interconnect and a local interconnect formed above the third contact, and
the third contact is connected to the first signal line through the local interconnect and the buried interconnect.

5. The semiconductor integrated circuit device of claim 3, wherein
the first standard cell has a local interconnect formed above the third contact, and
the third contact is connected to the first signal line through the local interconnect.

6. The semiconductor integrated circuit device of claim 3, wherein
the first standard cell has a logic circuit, and
the first signal line connected to the third contact is connected to an output or input of the logic circuit.

7. A semiconductor integrated circuit device, comprising:
a first semiconductor chip; and
a second semiconductor chip stacked on the first semiconductor chip,
wherein
a back face of the first semiconductor chip and a principal face of the second semiconductor chip are opposed to each other,
the first semiconductor chip includes
a plurality of standard cells,
a first power line laid in a buried interconnect layer, extending in a first direction and supplying a first power supply voltage to the plurality of standard cells,
a second power line laid in the buried interconnect layer, extending in the first direction, placed adjacently to the first power line in a second direction perpendicular to the first direction, and supplying a second power supply voltage to the plurality of standard cells,
a third power line laid in the buried interconnect layer, extending in the first direction, placed adjacently to the second power line in the second direction on a side opposite to the first power line, and supplying the first power supply voltage to the plurality of standard cells,
a first contact provided between the first power line and the back face of the first semiconductor chip,
a second contact provided between the second power line and the back face of the first semiconductor chip, and
a third contact provided between a first signal line connected to any of the plurality of standard cells and the back face of the first semiconductor chip, and
the third contact has an overlap with the second contact in the second direction and is at a position different from positions of the first and second contacts in the first direction, in planar view.

8. The semiconductor integrated circuit device of claim 7, wherein
the second semiconductor chip includes
a second signal line laid in a first interconnect layer that is an interconnect layer closest to the principal face, and
the third contact is connected to the second signal line.

9. The semiconductor integrated circuit device of claim 7, wherein
the plurality of standard cells include a first standard cell that is a double-height cell having the third contact.

10. The semiconductor integrated circuit device of claim 9, wherein
the first standard cell has a buried interconnect and a local interconnect formed above the third contact, and
the third contact is connected to the first signal line through the local interconnect and the buried interconnect.

11. The semiconductor integrated circuit device of claim 9, wherein
the first standard cell has a local interconnect formed above the third contact, and
the third contact is connected to the first signal line through the local interconnect.

12. The semiconductor integrated circuit device of claim 9, wherein the first standard cell has a logic circuit, and the first signal line connected to the third contact is connected to an output or input of the logic circuit.

13. A semiconductor integrated circuit device, comprising:

a first semiconductor chip; and a second semiconductor chip stacked on the first semiconductor chip, wherein a back face of the first semiconductor chip and a principal face of the second semiconductor chip are opposed to each other, the first semiconductor chip includes a plurality of standard cells, a first power line laid in a buried interconnect layer, extending in a first direction and supplying a first power supply voltage to the plurality of standard cells, a first contact provided between the first power line and the back face of the first semiconductor chip, and a second contact provided between a first signal line connected to any of the plurality of standard cells and the back face of the first semiconductor chip, and the first power line has a first portion and a second portion apart from each other in the first direction, and the second contact is located between the first portion and the second portion in the first direction and has an overlap with the first power line in a second direction perpendicular to the first direction, in planar view.

14. The semiconductor integrated circuit device of claim 13, wherein the first semiconductor chip includes a first metal interconnect formed in a metal interconnect layer located above the buried interconnect layer, extending in the first direction and electrically connecting the first portion and the second portion, and the first metal interconnect has an overlap with the second contact in planar view.

15. The semiconductor integrated circuit device of claim 13, wherein the second semiconductor chip includes a second signal line laid in a first interconnect layer that is an interconnect layer closest to the principal face, and the second contact is connected to the second signal line.

16. The semiconductor integrated circuit device of claim 13, wherein the plurality of standard cells include a first standard cell that is a double-height cell having the second contact.

17. The semiconductor integrated circuit device of claim 16, wherein the first standard cell has a buried interconnect and a local interconnect formed above the second contact, and the second contact is connected to the first signal line through the local interconnect and the buried interconnect.

18. The semiconductor integrated circuit device of claim 16, wherein the first standard cell has a local interconnect formed above the second contact, and the second contact is connected to the first signal line through the local interconnect.

19. The semiconductor integrated circuit device of claim 16, wherein the first standard cell has a logic circuit, and the first signal line connected to the second contact is connected to an output or input of the logic circuit.

* * * * *